United States Patent
Wark et al.

[11] Patent Number: 5,982,018
[45] Date of Patent: Nov. 9, 1999

[54] THIN FILM CAPACITOR COUPONS FOR MEMORY MODULES AND MULTI-CHIP MODULES

[75] Inventors: James M. Wark; Salman Akram, both of Boise, Id.

[73] Assignee: Micron Technology, Inc., Boise, Id.

[21] Appl. No.: 08/862,726

[22] Filed: May 23, 1997

[51] Int. Cl.[6] ............................ H01L 29/00; H01L 23/02
[52] U.S. Cl. ........................................ 257/532; 257/924
[58] Field of Search .............................. 257/532, 924

[56] References Cited

U.S. PATENT DOCUMENTS

| | | | |
|---|---|---|---|
| 4,410,905 | 10/1983 | Grabbe | 357/80 |
| 4,680,613 | 7/1987 | Daniels et al. | 352/72 |
| 4,879,631 | 11/1989 | Johnson et al. | 361/386 |
| 4,984,059 | 1/1991 | Kubota et al. | 357/68 |
| 4,994,936 | 2/1991 | Hernandez | 361/306 |
| 5,010,387 | 4/1991 | Dunaway et al. | 357/70 |
| 5,063,432 | 11/1991 | Mu | 357/70 |
| 5,095,402 | 3/1992 | Hernandez et al. | 361/306 |
| 5,099,306 | 3/1992 | Dunaway et al. | 357/70 |
| 5,103,283 | 4/1992 | Hite | 357/51 |
| 5,140,496 | 8/1992 | Heinks et al. | 361/306 |
| 5,155,656 | 10/1992 | Narashimhan et al. | 361/309 |
| 5,200,364 | 4/1993 | Loh | 437/209 |
| 5,212,402 | 5/1993 | Higgins, III | 257/532 |
| 5,228,192 | 7/1993 | Salatino | 29/827 |
| 5,266,821 | 11/1993 | Chern et al. | 257/312 |
| 5,272,590 | 12/1993 | Hernandez | 361/306.2 |
| 5,283,717 | 2/1994 | Hundt | 361/813 |
| 5,304,506 | 4/1994 | Porter et al. | 437/60 |
| 5,307,309 | 4/1994 | Protigal et al. | 365/63 |
| 5,329,237 | 7/1994 | Horch | 324/501 |
| 5,369,545 | 11/1994 | Bhattacharyya et al. | 361/306.2 |
| 5,403,784 | 4/1995 | Hashemi et al. | 437/217 |
| 5,444,600 | 8/1995 | Dobkin et al. | 361/303 |
| 5,498,906 | 3/1996 | Roane et al. | 257/724 |

*Primary Examiner*—Teresa M. Arroyo
*Attorney, Agent, or Firm*—Trask, Britt & Rossa

[57] ABSTRACT

A semiconductor device including a thin coupon capacitor mounted to the backside of a semiconductor die. When mounted active surface up on a carrier substrate of a multi-chip module, the coupon is secured between the backside of the die and the substrate. When flip-chip connections or direct chip attach are employed between the die and substrate, the coupon is secured to the backside of the die. The coupons may be preformed, or formed on the die in a wafer-scale fabrication process prior to singulation of the dice.

33 Claims, 6 Drawing Sheets

THIN FILM CAPACITOR COUPONS FOR MEMORY MODULES AND MULTI-CHIP MODULES

BACKGROUND OF THE INVENTION

1. Field of the Invention

The invention relates to semiconductor chip or die assemblies and, more particularly, to such assemblies wherein a thin-film coupon-type decoupling capacitor is positioned adjacent to the backside of a die. The invention also encompasses methodology for constructing such assemblies.

2. State of the Art

Traditionally, a widely-employed chip assembly (sometimes called a die assembly or a semiconductor device assembly) has comprised a die that is attached to a lead frame. The lead frame provides physical support for the die and is used to connect the die with external circuitry. Generally, lead frames are fabricated from a strip of sheet metal by stamping or chemical milling (etching) and are made from various materials depending on cost, fabrication, and functional requirements. The lead frame may have from four to over one hundred leads or pins. After connecting wires are bonded between the die and leads, the die, wires, and inner ends of the lead frame leads are encapsulated with a plastic encapsulant or located in a preformed cavity-type carrier (generally ceramic, or metal if mil-spec packaging standards apply) to complete the chip assembly.

The various leads of the lead frame (or chip assembly provide paths for different electrical signals. For example, some lead fingers may conduct data signals between the chip assembly and other chip assemblies. Other lead fingers may conduct address signals used to address memory locations in the chip assembly or another chip assembly. Other lead fingers conduct control signals. Still other lead fingers provide paths for power or ground signals. In some chip assemblies, more than one lead finger provides power or ground. In the case of some chip assemblies, multiple lead fingers carrying power signals may be electrically isolated from each other so that the power signals may have different voltage, current, and/or frequency characteristics to satisfy the requirements of different power groups on the same chip. Likewise, multiple lead fingers carrying ground signals may be electrically isolated from each other. Power signals are sometimes referred to as Vcc (or by a similar nomenclature, such as Vccx, Vccq, Vcc1, Vcc2). Ground signals are sometimes referred to as Vss (or by a similar nomenclature, such as Vssx, Vssq, Vss1, Vss2).

With each passing year, newly developed dice provide ever-increasing levels of performance in capacity and speed with little increase, or sometimes even a decrease, in size of the overall die. Indeed, progress in that regard has been astounding. In some instances, the increase in capacity occurs as a result of an increase in density or the number of transistors per units area of material. The increase in speed may be facilitated by an increase in clock frequency or smaller rise times.

Increases in capacity and speed are not achieved without attendant disadvantages. For example, a substantial amount of noise may be created by the switching of huge numbers of transistors. The noise is experienced particularly on the power bus (sometimes referred to as Vcc). One solution is to provide a decoupling capacitor between Vcc and ground (sometimes referred to as Vss). The decoupling capacitor(s) provides a path to ground for high frequency signals, thereby removing them from the power bus.

An on-chip decoupling capacitor may be formed by using a MOSFET (metal oxide semiconductor field effect transistor). The more the capacitance needed, the more silicon (or GaAs) space will be consumed. However, there is usually little, if any, excess silicon space on a state-of-the-art die to implement such an approach. Accordingly, decoupling capacitors have generally been placed off the die.

For example, in U.S. Pat. No. 4,680,613 to Daniels et al. (the "'613 patent"), a decoupling capacitor 50 is connected between a power lead finger tab 21 and a ground plate 40, in the package but off the die 14. The power lead finger 22 is formed with an opening or cutout opening 55 with a power lead finger tab 21 adjacent to the opening. (Col. 7, line 66 through col. 8, line 20). The lead frame 20 is formed with a central opening without a die attach paddle or paddle supports and a dielectric layer 30 is also formed with a central opening in alignment with the central opening of the lead frame 20, forming a cavity 16 so that a chip or die 14 may be bonded directly to the ground plate 40 which forms a die attach plate. (Col. 7, lines 62–68).

Col. 1 of the '613 patent discusses problems with inductive impedance created by long parallel lines or runs of adjacent conductive strips or traces formed by the lead frame fingers. The '613 patent further states that in order to accomplish the various objectives of that invention, the invention provides an improved low inductive impedance dual in-line package for an integrated circuit die incorporating an elongate lead frame formed with a central opening but without a die-attach paddle in the central opening and without paddle supports. A ground plate forms the die-attach plane, parallel with and spaced from the lead frame. (Col. 3, lines 17–25). The '613 patent also states the decoupling capacitor is contained within the package itself, closer to the chip, thereby minimizing the series inductance of leads across which undesired voltages are generated. (Col. 5, lines 7–11).

U.S. Pat. No. 4,994,936 to Hernandez (the "'936 patent") describes a decoupling capacitor that is attached directly to an IC lead frame and thereafter encapsulated within a molded package along with an IC chip, resulting in a decoupling scheme which is internal to the molded IC package. The '936 patent also notes advantages in noise decoupling with low inductance and describes a chip package in which a large, thin decoupling capacitor 34 is attached to the bottom surface of a die support platform 22. The decoupling capacitor 34 comprises a dielectric 36 between conductors 38 and 40.

As semiconductor technology progresses, the trend is to employ unpackaged, or "bare," die secured directly to a carrier substrate, omitting the lead frame and packaging formerly employed. In such so-called "chip-on-board" (COB) configurations comprising multi-chip modules (MCMs), the dice are connected to terminal pads of conductors on the substrate, as by wire bonding, flip-chip bonding or use of a flex circuit dielectric carrying foil-type conductors. Nonetheless, the need for decoupling capacitors continues and must be accommodated.

Referring to FIG. 1 herein, an exemplary prior art MCM 10 includes a die 14 and a die 16 connected to a substrate 20. Dice 14 and 16 may be packaged or unpackaged. Chip capacitors 22A and 22B provide decoupling capacitance for die 14, and may serve different power groups on die 14 if required. Chip capacitors 26A and 26B likewise provide decoupling capacitance for die 16. Another prior art assembly is depicted in FIG. 2 herein, wherein a die 30 is connected to a substrate 32 and is connected to external circuitry through wire bonds 34. Die 30 may be encapsulated with an optional glob top 40. A remote chip capacitor 42 provides decoupling capacitance.

Chip capacitors are effective in providing decoupling capacitance, but take up valuable surface or "real estate" on the printed circuit board or other carrier substrate carrying the dice and decoupling capacitors, particularly in an MCM configuration.

One approach to reducing the substrate real estate is disclosed in U.S. Pat. No. 4,879,631, assigned to the assignee of the present invention. The '631 patent disclosed the use of packaged, surface-mount dice superimposed over surface-mount capacitors in a single in-line memory module (SIMM) configuration. This configuration is not, however, suitable for current state-of-the-art MCMs employing unpackaged, or "bare dice". Such modules include SIMM as well as dual in-line memory module (DIMM) configurations, as well as other modules employing dice having functions other than memory.

Several decoupling capacitor configurations are disclosed in U.S. Pat. No. 5,095,402 to Hernandez, including the aforementioned remote chip capacitor (FIG. 1A), a decoupling capacitor placed under a packaged die (FIG. 2A), a lead frame mounted capacitor as in Hernandez '936 (FIG. 3A), a flat capacitor formed on a base or substrate attached to a lead frame and on which a die is back-mounted (FIG. 4A), and decoupling capacitors flip-chip mounted on the active surface of a die supported by its backside on a lead frame or the carrier (FIGS. 5A, 6A and 12).

U.S. Pat. No. 4,410,905 to Grabbe discloses a chip carrier whereon an interdigitated capacitive electrode structure is employed under the die-attach location on the carrier, the die then being connected to power and ground through buses associated with the capacitor structure. Such an arrangement requires the in situ formation of each capacitor on its chip carrier, and the configuration of the capacitor limits its capacitance and renders the structure susceptible to shorting due to the presence of bubbles or other voids in the glass-type dielectric.

SUMMARY OF THE INVENTION

The present invention provides a semiconductor device comprising at least one die having a decoupling capacitor comprising a thin coupon ("capacitor coupon") mounted adjacent its backside and to which it is electrically connected. The coupon comprises at least two electrode plates with a dielectric film disposed therebetween. The coupon adds no significant height to the semiconductor device when it is mounted to a carrier substrate as part of, for example, a SIMM or DIMM, so that adequate clearance remains between adjacent boards when installed in the bays of a personal computer. Additionally, the close proximity of the coupon capacitor to its associated die and the relatively short conductive connections therebetween minimize undesirable inductance and overall impedance attributable to the presence of the capacitor.

In one embodiment, the semiconductor device includes a capacitor coupon mounted to the surface of a carrier substrate such as a printed circuit board and having a semiconductor die back-mounted thereto. The capacitor is of like size and shape to the footprint of the die as mounted, and may include one or more tab-like electrode extensions or projections to which Vss (ground) or Vcc (power) bond pads of the die may be wire-bonded. Alternatively, one of the electrodes may extend beyond one or more side peripheries of the die along one or more entire sides of the die, and provide a bus to which appropriate power or ground bond pads may be wire-bonded. The capacitor coupon is electrically isolated from conductors carried by the substrate, but one of the capacitor electrodes may be electrically connected to the die through a direct conductive connection to the backside of the die. Similarly, the coupon may be placed so that an outer, exposed electrode is intentionally connected to, for example, a ground conductor on the surface of the carrier substrate.

Another embodiment of the invention also employs a capacitor coupon affixed to the backside of a die, but in this instance, the die is configured with conductive bumps on its active surface for facing, or so-called "flip-chip", connection to terminal pads of conductors on the surface of a carrier substrate. Again, one electrode connection may be made directly to the backside of the die, while the other electrode may be connected to a substrate conductor by a wire bond, flex circuit (TAB) connection using conductors carried on a thin dielectric, or a conductive epoxy may be employed.

Yet another embodiment employs a capacitor coupon-backed die in a direct chip attach (DCA) configuration, wherein a die is configured with an edge connection pattern for plugging into a slot in a carrier substrate. Required connections between the active surface of a die and the capacitor electrodes may be made with wire bonds, TAB tape connections, or by deposition of conductive paths over the exterior of the die extending from the active surface to the backside. One or more vias may also extend from the active side of the die and through the die itself to contact one or more of the electrodes of the coupon.

The capacitor coupons of the present invention may be preformed of layers of conductive foil and dielectric, such as a polyimide tape, and dispensed from a stack or a reel for, placement on a carrier substrate. If desired, both sides of each coupon may be provided with a preplaced adhesive (conductive or non-conductive, as required) for affixation of each coupon to a carrier substrate and of a die to each coupon.

Alternatively, the capacitor coupons may be formed in desired locations on a carrier substrate such as that of a SIMM or DIMM by conventional semiconductor die fabrication techniques, such as spinning on dielectric layers of liquid polyimide, and sputtering aluminum electrode layers. The coupons may similarly be formed by wafer-scale fabrication techniques on a silicon or ceramic substrate, singulated and then placed on a carrier substrate in desired positions and orientations in conventional pick-and-place operations. The coupons may also be formed during fabrication of semiconductor dice on a wafer or other semiconductor substrates, by deposition or application of the electrode and dielectric layers to the back of the wafer prior to singulation of the dice therefrom.

The capacitance of each coupon may be altered by varying the mutually cooperative area of the electrodes or varying the distance between the electrodes. The total cooperative area of the electrodes may be enhanced by providing a capacitive structure with numerous layers comprising each electrode, such as by employing a convoluted or folded electrode structure.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
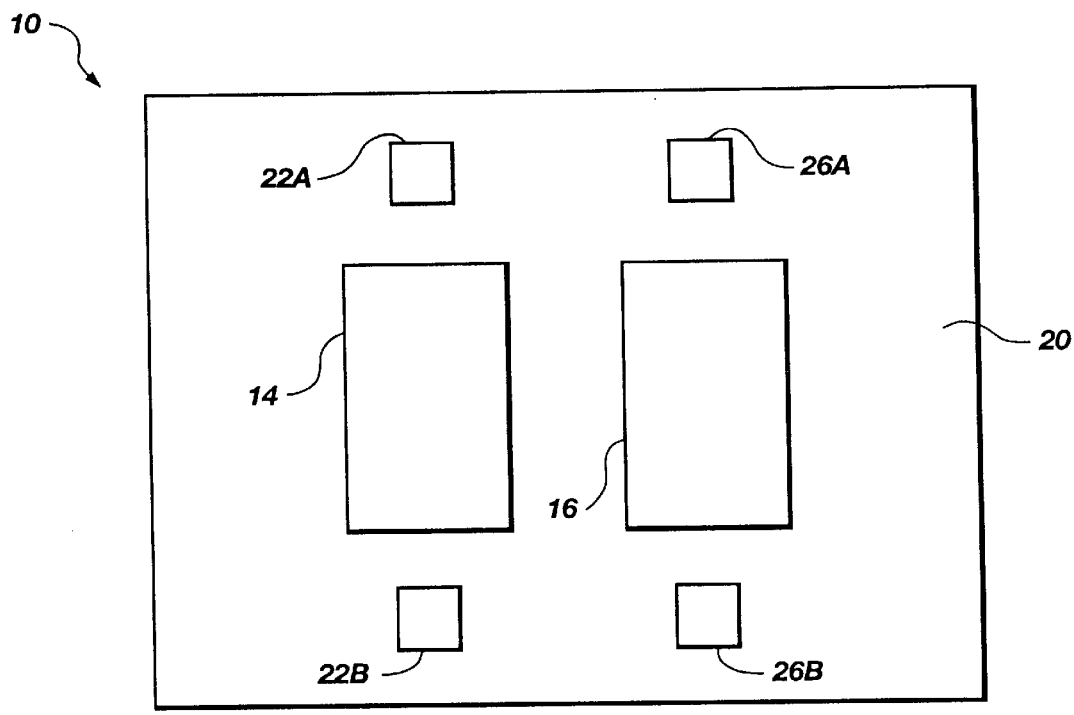
FIG. 1 shows a top view of a prior art multi-chip module including chip capacitors.
Figure 3:
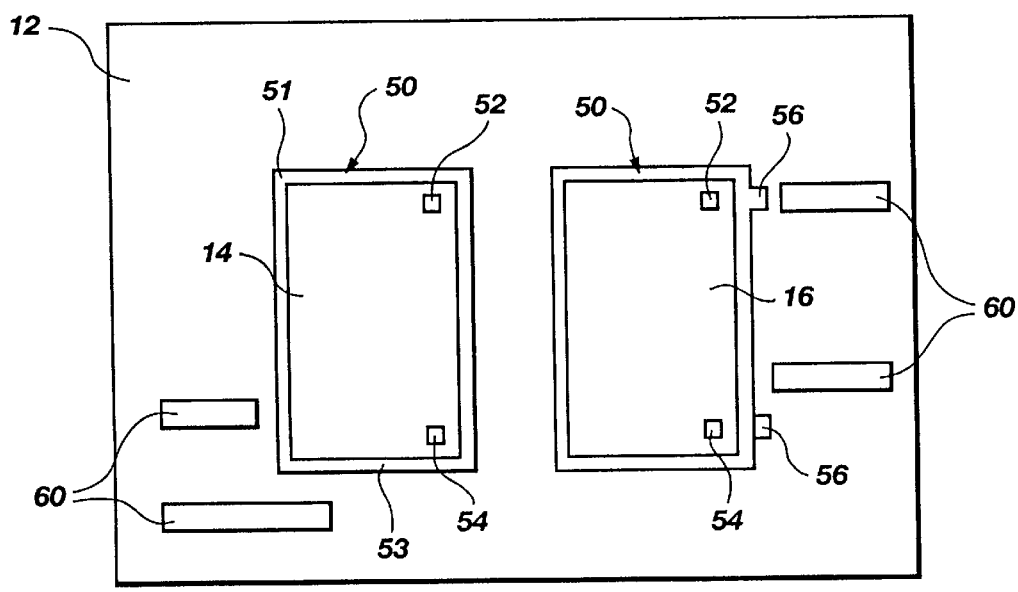
FIG. 3 shows a multi-chip module similar to that of FIG. 1 wherein thin film capacitor coupons of the present invention are positioned according to the invention between each die and a carrier substrate.
Figure 2:
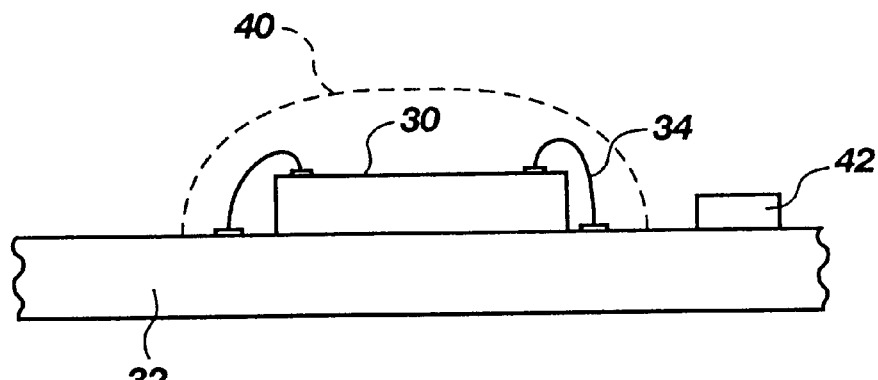
FIG. 2 shows a side view of a prior art die and a chip capacitor on a substrate.
Figure 4:
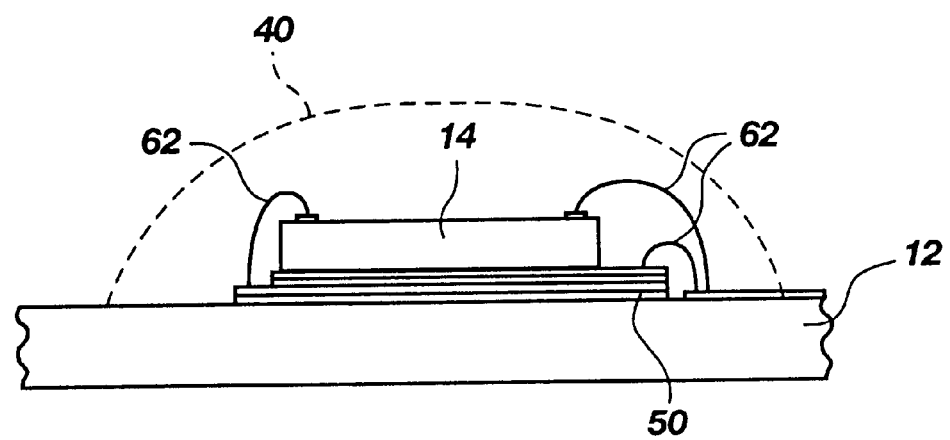
FIG. 4 shows a side view of a thin film capacitor coupon positioned according to the invention between a die and a carrier substrate.

Referring to FIG. 3 of the drawings, an MCM substrate 12 is depicted with dice 14 and 16 mounted thereto over capacitor coupons 50. As shown, coupons 50 extend slightly beyond the side peripheries of dice 14 and 16 to facilitate wire bonding thereto from selected bond pads 52 for power and 54 for ground (other bond pads not shown for clarity). Further, as shown with respect to die 14, one capacitor electrode may extend beyond a die periphery on two sides, and the other may extend beyond the die periphery along the other two sides, thus providing enhanced bus areas 51 and 53 for connections of power and ground for multiple power groups from both die 14 and conductors 60 on the carrier substrate. Alternatively, as shown with respect to die 16, electrodes of coupons 50 may be provided with tab-like projections 56 optimally located for wire-bonding to selected bond pads 52 and 54 of die 16, and to conductors 60 on substrate 12. An exemplary side view of such wire bonds 62 is depicted in FIG. 4. Also as shown in FIG. 4, a die such as die 14, supported on a capacitor coupon 50, may be encapsulated such as by a silicone gel mass, or "glob-top" 40.

Figure 5:
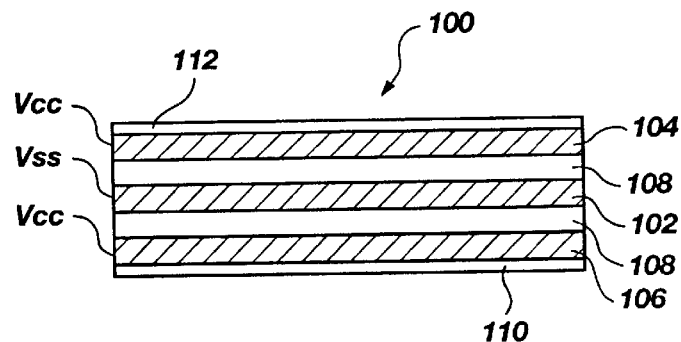
FIG. 5 shows a side view of a first embodiment of a multi-layer thin film capacitor coupon.
Figure 6:
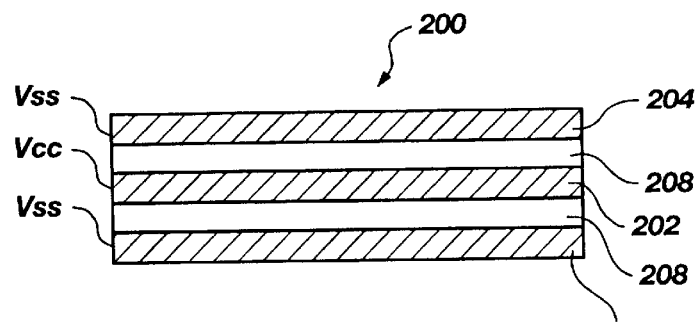
FIG. 6 shows a side view of a second embodiment of a multi-layer thin film capacitor coupon.
Figure 7:
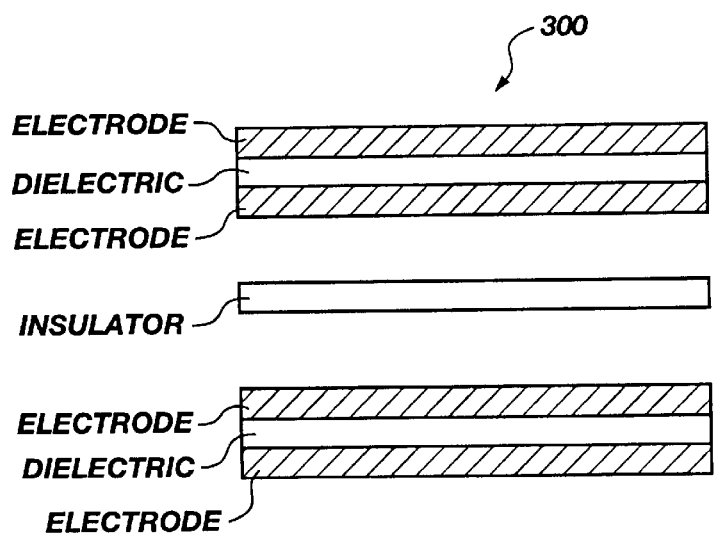
FIG. 7 shows a side view of a third embodiment of a multi-layer thin film capacitor coupon.

As shown in FIGS. 5 through 7, the capacitor coupon 50 may comprise a multi-capacitor structure formed by the use of at least three electrodes with intervening dielectrics. Thicknesses of the various layers of the capacitor coupons illustrated are greatly exaggerated for clarity, it being a notable feature of the invention that the capacitor coupons in actuality are quite thin so as to minimize any height increase of an associated semiconductor die above a carrier substrate to which the die is mounted.

In FIG. 5, capacitive structure 100 is shown as comprising a central, common Vss electrode 102 interposed between upper and lower Vcc electrodes 104 and 106, a dielectric material 108 such as a polyimide being disposed between the electrodes. A non-conductive adhesive 110 may be applied to lower electrode 106 for insulated attachment of the coupon 50 to a conductive trace of a carrier substrate, while a conductive adhesive 112 may be applied to upper electrode 104 to effect a conductive connection to the backside of a die 14.

In FIG. 6, in capacitive structure 200, the Vss and Vcc electrode locations are reversed, with a common, central Vcc electrode 202 disposed between upper and lower Vss electrodes 204 and 206, dielectric films 208 being disposed between each of the electrodes. As with structure 100, adhesives (not shown) may be pre-applied to the upper and lower surfaces of structure 200 for affixation to a die and a carrier substrate.

FIG. 7 schematically depicts the use of multiple stacks of electrodes and intervening dielectrics to either enhance the capacitance of a single capacitive structure 300, or to provide a series of stacked but discrete decoupling capacitors under the same die for use with different power groups of the die. Of course, each capacitor of the stack will be insulated from those above and/or below it.

As previously described, the capacitor coupons of the present invention may be formed by several processes known in the art. For example, a thin dielectric film comprising a polyimide, such as a Kapton™ tape, may be laminated between two conductive foil tapes of copper, aluminum, or other suitable metals, and the resulting laminate coiled on a reel for subsequent singulation, severance and application to a substrate. If desired, the foils may be stamp-cut in particular configurations to provide desired extensions such as bus areas, tabs, etc. for external electrical connection, and placed with a stamp-cut dielectric film therebetween, the resulting coupon assemblies being suitable for retrieval from a stack or carrier tape and application to an MCM substrate using conventional pick-and-place equipment.

Alternatively, the coupons may be formed in situ in desired locations and configurations on a substrate by conventional sputtering techniques, in the case of aluminum electrodes, and spin-on techniques in the case of polyimide or other liquefiable dielectrics. Photolithography may be employed to generate precise electrode structures, and photoresists (positive or negative) may be used to precisely define dielectric locations and shapes. Any suitable material may be employed for the carrier substrates employed with the present invention. For example, silicon, ceramics, fiberglass laminates such as FR-4, tape automated bonding (TAB) or larger flexible dielectric substrates carrying foil conductors, or molybdenum with a suitable insulative covering.

Figure 8:
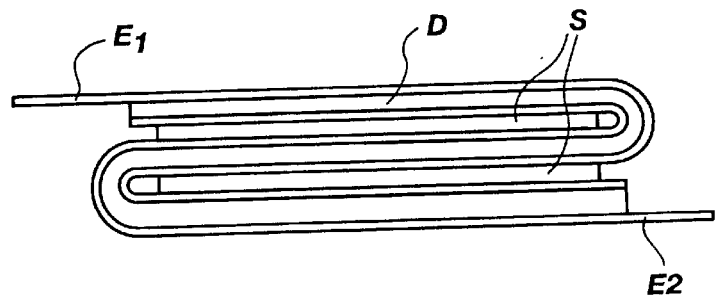
FIG. 8 shows a side view of a fourth embodiment of a multi-layer thin film capacitor coupon.

FIG. 8 depicts the use of a convoluted electrode configuration wherein two sheets of electrode material E1 and E2 with an intervening dielectric film D are folded back upon themselves one or more times over intervening insulative spacers S. Thus, the capacitance of the structure may be enhanced while its thin, coupon-like side profile is maintained. If desired, and as shown, one electrode E1 may extend from one end of the convoluted stack for wire-bonding or other electrical connection, while the other electrode E2 may extend from the other end of the stack for electrical connection thereto.

Figure 9:
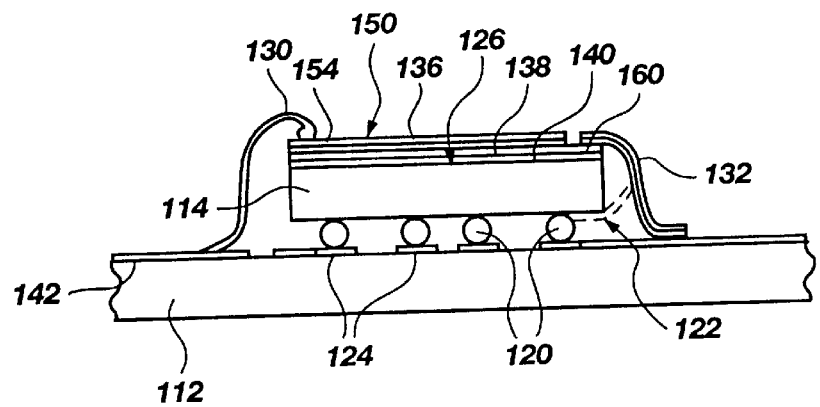
FIG. 9 shows a side view of a flip-chip embodiment of a semiconductor device employing a capacitor coupon according to the present invention.

FIG. 9 depicts another embodiment of the present invention, wherein a die 114 is configured with conductive bumps 120 on its active surface 122 for facing, or "flip-chip," connection to conductive terminals 124 of carrier substrate 112. Conductive bumps 120 may comprise a traditional tin/lead solder, or a conductive or conductor-filled epoxy. In this regard, a so-called "B-stage" conductive epoxy may be particularly suitable, being partially curable to a stable state after application, and fully curable for adherence to substrate conductors after disposition in place on the carrier substrate.

In the flip-chip configuration, a capacitor coupon 150 is applied to (or as later described, formed on) the backside 126 of die 114. Connections between the electrodes of capacitor coupon 150 and conductors on the substrate may be effected by wire bonds 130 or foil conductors 132 carried on a TAB tape, the latter also being a particularly suitable technique for connecting bond pads on active surface 122 to the electrodes, as shown in broken lines.

FIG. 9 also illustrates an electrode structure wherein one conductive connection is made to an outer electrode 154, and the other to a laterally extended inner electrode 160, and the capacitor coupon 150 is electrically isolated by insulating or dielectric layer 140 from the backside 126 of die 114. Of course, the thickness of the capacitor coupon 150 and of layer 140 is greatly exaggerated for clarity. Further, if a ground or reference electrical connection is effected directly between the backside 126 of die 114 and inner electrode 138 of capacitor coupon 150, it will be appreciated that only one connection between capacitor coupon 150 and a conductive trace 142 on carrier substrate 114 may be required.

Figure 10:
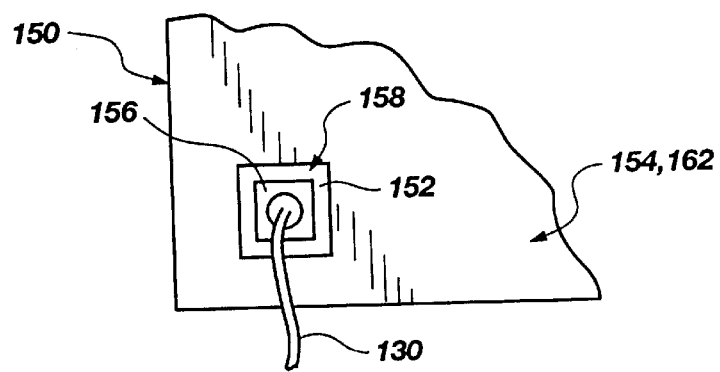
FIG. 10 shows an enlarged portion of the backside of the flip-chip die of FIG. 9, depicting an aperture through an outer electrode and dielectric providing access to an inner capacitor electrode.

FIG. 10 shows an enlargement of a corner of a capacitor coupon 150 as viewed from above. The arrangement of FIG. 10 may be employed in lieu of that shown in FIG. 9 to effect an electrical connection to inner electrode 160 of capacitor coupon 150. Aperture 152 extends through outer electrode 154 and is aligned with slightly smaller aperture 156 through dielectric layer 158, exposing inner electrode 160 for a wire bond 130. In capacitor coupons comprising multiple stacks of electrodes and dielectrics, additional aligned apertures may be employed to reach whatever inner electrode is desired. The apertures may be cut or otherwise formed during definition of preformed capacitor elements if film-type dielectrics and foil-type electrodes are employed in the capacitor coupon, the coupon is masked and etched in one or more steps to define the apertures, or the capacitor coupon is formed with the apertures in place by a multi-step deposition process on the backside of a die prior to singulation from a wafer-scale semiconductor substrate. It should be noted that outer electrode 154 may be covered with an insulator 162, as desired, and an aperture formed through the insulator 162 as well as the electrode 154. It is also contemplated that the apertures 152, 156 may comprise open-ended "notches" as depicted in FIG. 12 with respect to another embodiment.

Figure 11:
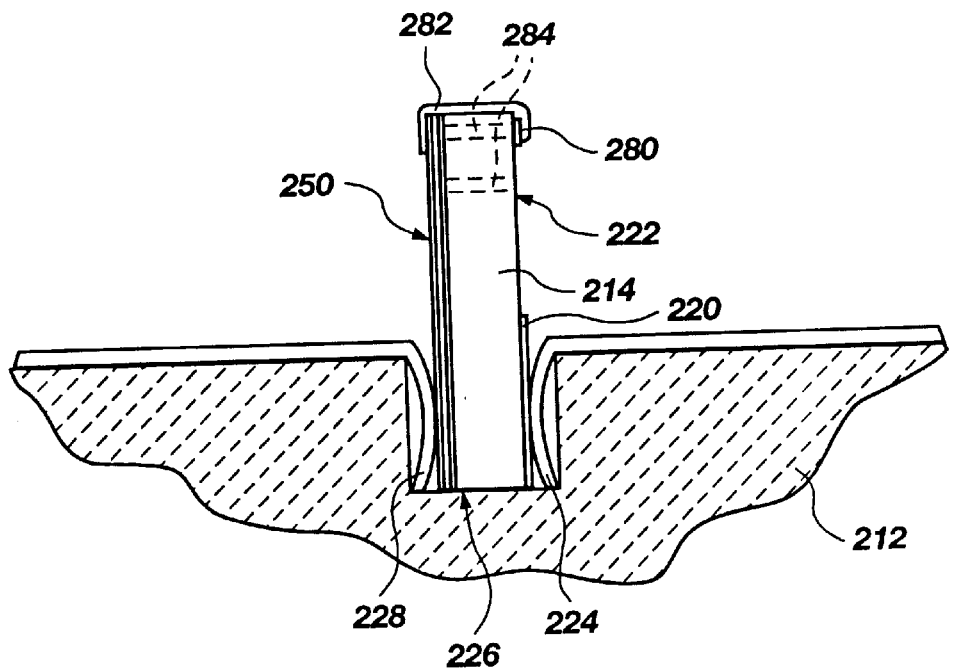
FIG. 11 shows a side view of a direct chip attach embodiment of a semiconductor device employing a capacitor coupon according to the present invention.

FIG. 11 depicts a semiconductor device incorporating a capacitor coupon in accordance with the invention wherein a die 214 is configured with traces 220 on its active surface 222 for direct chip attach to conductive connectors 224 of a carrier substrate 212 having a slot 226 for receiving one edge of die 214. In this arrangement, capacitor coupon 250 is placed or formed on the backside of die 214, where it may be directly contacted by conductive connectors 228 located on the opposite side of slot 226 from connectors 224. One or both sets of connectors 224 and 228 may be spring-loaded or otherwise mechanically biased to firmly grip die 214 between the two sets of connectors 224 and 228.

Figure 12:
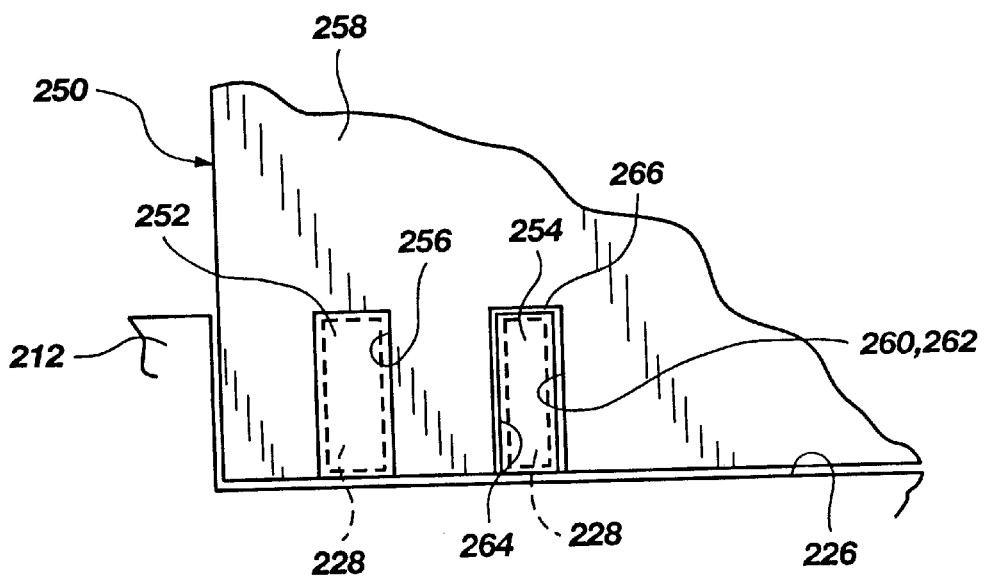
FIG. 12 shows an enlarged portion of the backside of the direct chip attach-configured device of FIG. 11, showing cutouts through a protective insulative layer and through an electrode and dielectric layer for effecting electrical connection between conductors of a carrier substrate and the capacitor.

As better shown in FIG. 12, connector 228 contact one or more electrodes 252, 254 through windows or apertures extending through various layers of capacitor coupon 250. For example, outermost electrode 252 is contacted through a window 256 in insulative covering 258, while an inner electrode 254 is contacted through a window 260 in insulative covering 258, an aligned window 262 in outermost electrode 252 and another aligned window 264 in dielectric 266. Similar windows, or windows as described with respect to FIG. 10, may be employed to connect power and ground contacts 280 on active surface 222 with electrodes of capacitor coupon 250 through wire bonds, TAB tape connections, conductive epoxy lines, or sputtered connecting lines, generally designated at 282. Further, although making fabrication of the die 214 more complex, the die may be provided with internal conductive vias (shown at 284 in broken lines) extending from the active surface 222 downward to the backside of the die, where connections may be made to electrodes of the capacitor, the aforementioned aperture or window technique being suitable for use with discrete dots of conductive adhesive placed in alignment with exposed backside ends of the vias to effect such connections. In addition, if the capacitor coupons are formed on a wafer scale by deposition as a series of superimposed electrode and dielectric layers, the various electrodes may be connected with the vias during the deposition process using conventional deposition, patterning and etching techniques, such as the previously-mentioned photolithographic techniques.

Figure 13:
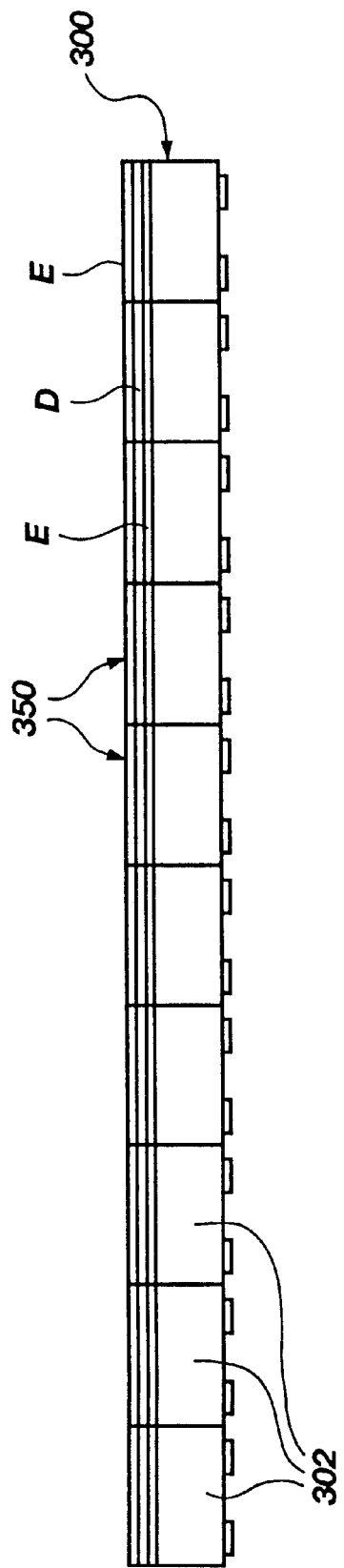
FIG. 13 shows a side view of a wafer including multiple dice on which thin film capacitor coupons are formed.

FIG. 13 schematically depicts the formation of capacitor coupons 350 in a wafer-scale operation on the backside of a wafer-scale semiconductor substrate 300, wherein alternating electrode layers E and dielectric layers D are applied after probe and backgrind of the wafer but prior to singulation of discrete dice 302. Optional insulative layers may also be applied between the wafer-scale substrate and the closest electrode layer, and/or over the outermost electrode, as desired or required, but have not been shown for clarity. The multilayered capacitive structure may be preformed from alternating sheets of conductors and dielectric and then adhered to the backside of the wafer-scale substrate, or applied as one preformed layer at a time adhered to the backside of the substrate or the previously-applied layer, as the case may be. Alternatively, the multilayer structure may be formed as a series of depositions of layers of material, such as sputtered aluminum for electrodes and spun-on polyimide as dielectric, such techniques having been previously mentioned.

Since the resulting capacitor coupons 350, after singulation of the dice and associated layered capacitive structure, will not extend laterally beyond the die boundaries, electrical connections to the capacitor coupons will be more challenging. However, if one electrical connection is made to the backside of the wafer and only a single connection is required (to the outermost electrode) each die may be placed on a carrier substrate having a conductor extending from under the die to one side thereof for external connection purposes. Further, in the case wherein the dice are to be configured for flip-chip or direct chip attach application to the carrier substrate, an aperture or window (as described above) can be formed through the outermost electrode and through the dielectric exposing both outer and inner electrodes for easy wire bonding.

While the invention has been described in terms of certain illustrated embodiments, it will be appreciated by those of ordinary skill in the art that it is not so limited. Additions, deletions and modifications may be made to the invention as illustrated, and features from one embodiment may be included in another embodiment without departing from the scope of the invention as hereinafter claimed.

What is claimed is:

1. A semiconductor device assembly, comprising:
   a carrier substrate bearing conductors thereon including a ground conductor and a power conductor;
   at least one semiconductor die having an active surface bearing integrated circuitry exhibiting a power contact and a ground contact, and having a backside opposite the active surface, the at least one semiconductor die mounted to the carrier substrate with the active surface facing the carrier substrate;
   a capacitor coupon positioned substantially parallel to and adjacent the backside of the at least one semiconductor die and of similar size and shape thereto; and
   electrical connections between the power and ground contacts of the at least one semiconductor die and the capacitor coupon and between the ground conductor and power conductor of the carrier substrate and the capacitor coupon.

2. A semiconductor device assembly, comprising:
   a carrier substrate bearing conductors thereon including a ground conductor and a power conductor;
   at least one semiconductor die mounted to the carrier substrate and having an active surface bearing integrated circuitry exhibiting a power contact and a ground contact, and having a backside opposite the active surface;
   a capacitor coupon positioned substantially parallel to and adjacent the backside of the at least one semiconductor die and of similar size and shape thereto; and
   electrical connections between the power and ground contacts of the at least one semiconductor die and the capacitor coupon and between the ground conductor and power conductor of the carrier substrate and the capacitor coupon, wherein both the at least one semiconductor die and the capacitor coupon are in direct contact with conductors of the carrier substrate.

3. A semiconductor device assembly, comprising:
   a carrier substrate bearing conductors thereon including a ground conductor and a power conductor;
   at least one semiconductor die mounted to the carrier substrate and having an active surface bearing integrated circuitry exhibiting a power contact and a ground contact, and having a backside opposite the active surface;
   a capacitor coupon positioned substantially parallel to and adjacent the backside of the at least one semiconductor die and of similar size and shape thereto, the capacitor coupon comprising at least three electrodes having dielectric disposed therebetween, at least one of the least three electrodes serving as a common electrode for at least two discrete capacitive structures with which others of the at least three electrodes are associated; and
   electrical connections between the power and ground contacts of the at least one semiconductor die and the capacitor coupon and between the ground conductor and power conductor of the carrier substrate and the capacitor coupon.

4. A semiconductor device assembly, comprising:
   a carrier substrate bearing conductors thereon including a ground conductor and a power conductor;
   at least one semiconductor die mounted to the carrier substrate and having an active surface bearing integrated circuitry exhibiting a power contact and a ground contact, and having a backside opposite the active surface;
   a capacitor coupon positioned substantially parallel to and adjacent the backside of the at least one semiconductor die, the capacitor coupon comprising two continuous, substantially coextensive, elongated electrodes having a dielectric disposed therebetween and configured in a convoluted stack of similar size and shape to the backside of the at least one semiconductor die; and
   electrical connections between the power and ground contacts of the at least one semiconductor die and the capacitor coupon and between the ground conductor and power conductor of the carrier substrate and the capacitor coupon.

5. The apparatus of claim 4, wherein one electrode of the two continuous, substantially coextensive, elongated electrodes extends beyond the other electrode at a first end of their substantial coextent, and the other electrode of the two continuous, substantially coextensive, elongated electrodes extends beyond the one electrode at a second end of their substantial coextent.

6. The apparatus of claim 4, wherein the convoluted stack includes insulative spacers disposed between adjacent, superimposed portions of electrodes not separated by a dielectric.

7. A semiconductor device assembly, comprising:
   a carrier substrate bearing conductors thereon including a ground conductor and a power conductor;
   at least one semiconductor die mounted to the carrier substrate and having an active surface bearing integrated circuitry exhibiting a power contact and a ground contact, and having a backside opposite the active surface;
   a capacitor coupon positioned substantially parallel to and adjacent the backside of the at least one semiconductor die and of similar size and shape thereto, the capacitor coupon including an aperture through at least one electrode thereof and through at least one dielectric to expose another electrode for effecting an electrical connection thereto; and
   electrical connections between the power and ground contacts of the at least one semiconductor die and the capacitor coupon and between the ground conductor and power conductor of the carrier substrate and the capacitor coupon, at least one of the electrical connections being effected through the aperture.

8. The apparatus of claim 7, wherein the at least one semiconductor die includes at least one conductive via extending from the active surface to the backside thereof and effecting an electrical connection with at least one electrode of the capacitor coupon.

9. A semiconductor device assembly, comprising:
   a carrier substrate bearing conductors thereon including a ground conductor and a power conductor;
   at least one semiconductor die mounted to the carrier substrate and having an active surface bearing integrated circuitry exhibiting a power contact and a ground contact, and having a backside opposite the active surface;
   a capacitor coupon positioned substantially parallel to and adjacent the backside of the at least one semiconductor die and of similar size and shape thereto, the capacitor coupon being defined along precise lateral boundaries of the backside of the at least one semiconductor die so as to be laterally coextensive therewith; and electrical connections between the power and ground contacts of the at least one semiconductor die and the capacitor coupon and between the ground conductor and power conductor of the carrier substrate and the capacitor coupon.

10. A semiconductor device comprising:

a semiconductor die having an active surface bearing integrated circuitry and a backside bearing a capacitor coupon having a laterally outer periphery of precisely the same size and shape as a laterally outer periphery of the semiconductor die.

11. The apparatus of claim 10, wherein the capacitor coupon was formed on the backside of the semiconductor die prior to singulation of the semiconductor die from a semiconductor substrate bearing a plurality of semiconductor dice.

12. The apparatus of claim 11, wherein the capacitor coupon was formed during singulation of the semiconductor die from the semiconductor substrate.

13. The apparatus of claim 10, wherein an electrode of the capacitor coupon is in direct electrical contact with the backside of the semiconductor die.

14. The apparatus of claim 10, wherein the capacitor coupon comprises at least three electrodes having dielectric disposed therebetween, at least one of the at least three electrodes serving as a common electrode for at least two discrete capacitive structures with which others of the at least three electrodes are associated.

15. The apparatus of claim 10, wherein the capacitor coupon comprises two continuous, substantially coextensive, elongated electrodes having a dielectric disposed therebetween and configured in a convoluted stack of similar size and shape to the backside of the semiconductor die.

16. The apparatus of claim 15, wherein one electrode of the two continuous, substantially coextensive, elongated electrodes extends beyond the other electrode at a first end of their substantial coextent, and the other electrode of the two continuous, substantially coextensive, elongated electrodes extends beyond the one electrode at a second end of their substantial coextent.

17. The apparatus of claim 10, wherein the capacitor coupon includes an electrode extension for effecting an electrical connection thereto.

18. The apparatus of claim 17, wherein the electrode extension comprises a discrete, tab-like protrusion.

19. The apparatus of claim 17, wherein the electrode extension comprises a portion of an electrode of the capacitor coupon protruding beyond the backside of the semiconductor die along at least a portion of a side thereof.

20. The apparatus of claim 10, wherein the capacitor coupon includes an aperture through at least one electrode thereof and through at least one dielectric to expose another electrode for effecting an electrical connection thereto.

21. The apparatus of claim 11, wherein the capacitor coupon includes at least one aperture through at least one electrode thereof and through at least one dielectric to expose another electrode for effecting an electrical connection thereto.

22. The apparatus of claim 15, wherein the convoluted stack includes insulative spacers disposed between adjacent, superimposed portions of electrodes not separated by a dielectric.

23. The apparatus of claim 20, wherein the semiconductor die includes at least one conductive via extending from the active surface to the backside thereof and effecting an electrical connection with at least one electrode of the capacitor coupon.

24. A semiconductor device assembly, comprising:

a carrier substrate bearing conductors thereon including a ground conductor and a power conductor;

a plurality of semiconductor dice mounted to the carrier substrate, each semiconductor die of the plurality having an active surface bearing integrated circuitry exhibiting a power contact and a ground contact, and having a backside opposite the active surface, at least one semiconductor die of the plurality being mounted with its active surface facing the carrier substrate;

a capacitor coupon associated with each of at least some of the plurality of dice, including the at least one semiconductor die mounted with its active surface facing the carrier substrate, the capacitor coupons being positioned substantially parallel and adjacent the backsides of their associated semiconductor dice and of similar size and shape thereto; and electrical connections between the power and ground contacts of each of the plurality of semiconductor dice having an associated capacitor coupon and its associated capacitor coupon and between said ground conductor and said power conductor of the carrier substrate and that capacitor coupon.

25. A semiconductor device assembly, comprising:

a carrier substrate bearing conductors thereon including a ground conductor and a power conductor;

a plurality of semiconductor dice mounted to the carrier substrate, each semiconductor die of the plurality having an active surface bearing integrated circuitry exhibiting a power contact and a ground contact, and having a backside opposite the active surface;

a capacitor coupon associated with each of at least some of the plurality of dice, including the at least one semiconductor die mounted with its active surface facing the carrier substrate, the capacitor coupons being positioned substantially parallel and adjacent the backsides of their associated semiconductor dice and of similar size and shape thereto; and electrical connections between the power and ground contacts of each of the plurality of semiconductor dice having an associated capacitor coupon and its associated capacitor coupon and between said ground conductor and said power conductor of the carrier substrate and that capacitor coupon, at least one semiconductor die of the plurality and the capacitor coupon associated therewith being in direct contact with said conductors of the carrier substrate.

26. A semiconductor device assembly, comprising:

a carrier substrate bearing conductors thereon including a ground conductor and a power conductor;

a plurality of semiconductor dice mounted to the carrier substrate, each semiconductor die of the plurality having an active surface bearing integrated circuitry exhibiting a power contact and a ground contact, and having a backside opposite the active surface;

a capacitor coupon associated with each of at least some of the plurality of dice, the capacitor coupons being positioned substantially parallel and adjacent the backsides of their associated semiconductor dice and of similar size and shape thereto, at least one of the capacitor coupons comprising at least three electrodes having dielectric disposed therebetween, at least one of the at least three electrodes serving as a common electrode for at least two discrete capacitive structures with which others of the at least three electrodes are associated; and electrical connections between the power and ground contacts of each of the plurality of semiconductor dice having an associated capacitor coupon and its associated capacitor coupon and between said ground conductor and said power conductor of the carrier substrate and that capacitor coupon.

27. A semiconductor device assembly, comprising:

a carrier substrate bearing conductors thereon including a ground conductor and a power conductor;

a plurality of semiconductor dice mounted to the carrier substrate, each semiconductor die of the plurality having an active surface bearing integrated circuitry exhibiting a power contact and a ground contact, and having a backside opposite the active surface;

a capacitor coupon associated with each of at least some of the plurality of dice, the capacitor coupons being positioned substantially parallel and adjacent the backsides of their associated semiconductor dice and of similar size and shape thereto, at least one capacitor coupon comprising two continuous, substantially coextensive, elongated electrodes having a dielectric disposed therebetween and configured in a convoluted stack of similar size and shape to the backside of its associated die; and electrical connections between the power and ground contacts of each of the plurality of semiconductor dice having an associated capacitor coupon and its associated capacitor coupon and between said conductor and said power conductor of the carrier substrate and that capacitor coupon.

28. The apparatus of claim 27, wherein one electrode of the two continuous, substantially coextensive, elongated electrodes extends beyond the other electrode at a first end of their substantial coextent, and the other electrode of the two continuous, substantially coextensive, elongated electrodes extends beyond the one electrode at a second end of their substantial coextent.

29. The apparatus of claim 27, wherein the convoluted stack includes insulative spacers disposed between adjacent, superimposed portions of electrodes not separated by a dielectric.

30. A semiconductor device assembly, comprising:

a carrier substrate bearing conductors thereon including a ground conductor and a power conductor;

a plurality of semiconductor dice mounted to the carrier substrate, each semiconductor die of the plurality having an active surface bearing integrated circuitry exhibiting a power contact and a ground contact, and having a backside opposite the active surface;

a capacitor coupon associated with each of at least some of the plurality of dice, the capacitor coupons being positioned substantially parallel and adjacent the backsides of their associated semiconductor dice and of similar size and shape thereto, at least one capacitor coupon including an aperture through at least one electrode thereof and through at least one dielectric to expose another electrode for effecting an electrical connection thereto; and electrical connections between the power and ground contacts of each of the plurality of semiconductor dice having an associated capacitor coupon and its associated capacitor coupon and between said ground conductor and said power conductor of the carrier substrate and that capacitor coupon.

31. The apparatus of claim 30, wherein at least one semiconductor die of the plurality of dice includes at least one conductive via extending from the active surface to the backside thereof and effecting an electrical connection with at least one electrode of its associated capacitor coupon.

32. A semiconductor device assembly, comprising:

a carrier substrate bearing conductors thereon including a ground conductor and a power conductor;

a plurality of semiconductor dice mounted to the carrier substrate, each semiconductor die of the plurality having an active surface bearing integrated circuitry exhibiting a power contact and a ground contact, and having a backside opposite the active surface;

a capacitor coupon associated with each of at least some of the plurality of dice, the capacitor coupons being positioned substantially parallel and adjacent the backsides of their associated semiconductor dice and of similar size and shape thereto, at least one capacitor coupon being defined along precise lateral boundaries of the backside of its associated semiconductor die; and electrical connections between the power and ground contacts of each of the plurality of semiconductor dice having an associated capacitor coupon and its associated capacitor coupon and between said ground conductor and said power conductor of the carrier substrate and that capacitor coupon.

33. A semiconductor device assembly, comprising:

a carrier substrate bearing conductors thereon including a ground conductor and a power conductor;

at least one semiconductor die having an active surface bearing integrated circuitry exhibiting a power contact and a ground contact, and having a backside opposite the active surface;

a capacitor coupon positioned substantially parallel to and adjacent the backside of the at least one semiconductor die and of similar size and shape thereto; and electrical connections between the power and ground contacts of the at least one semiconductor die and the capacitor coupon and between the ground conductor and power conductor of the carrier substrate and the capacitor coupon, the at least one semiconductor die including at least one conductive via extending from the active surface to the backside thereof and effecting at least one electrical connection between a contact and an electrode of the capacitor coupon.

* * * * *

UNITED STATES PATENT AND TRADEMARK OFFICE
CERTIFICATE OF CORRECTION

PATENT NO. : 5,982,018
DATED : November 9, 1999
INVENTOR(S) : Wark et al.

It is certified that error appears in the above-identified patent and that said Letters Patent is hereby corrected as shown below:

Title page,
ABSTRACT,
Line 1, change "coupon capacitor" to -- capacitor coupon --.

Drawings,
Fig. 9, delete reference numeral "136" and change reference numeral "112" to -- 113 --; and
Fig. 13, change reference numeral "300" to -- 312 --.

Column 1,
Line 28, change "(or chip assembly" to -- ( or chip assembly) --;

Column 3,
Line 8, change "disclosed" to -- discloses --;
Line 13, change ""bare dice"." to -- "bare," dice. --;
Line 32, change "in situ" to -- *in situ* --;

Column 4,
Line 40, after "polyimide" delete ",";
Line 47, after "substrates" delete ",";

Column 6,
Line 24, after "300" delete ",";
Line 44, change "in situ" to -- *in situ* --;

Column 7,
Line 33, change "114" to -- 113 --;

Column 8,
Line 35, change "300," to -- 312, --; and
Line 65, after "dielectric" insert -- , --;

Column 9, claim 3,
Line 55, before "least" at the beginning of the line insert -- at --;

Column 12, claim 24,
Line 10, change "ground contact ," to -- ground contact, --;

UNITED STATES PATENT AND TRADEMARK OFFICE
CERTIFICATE OF CORRECTION

PATENT NO. : 5,982,018
DATED : November 9, 1999
INVENTOR(S) : Wark et al.

It is certified that error appears in the above-identified patent and that said Letters Patent is hereby corrected as shown below:

Column 12, claim 25,
Line 36, delete "including the at least one";
Line 37, delete entire line;
Line 38, delete "facing the carrier substrate,", and Column 13, claim 27,
Line 32, after "said" insert -- ground --.

Signed and Sealed this

Nineteenth Day of March, 2002

Attest:

JAMES E. ROGAN
Attesting Officer    Director of the United States Patent and Trademark Office